United States Patent
Grottenmueller et al.

(10) Patent No.: US 10,927,220 B2
(45) Date of Patent: Feb. 23, 2021

(54) SILAZANE-SILOXANE RANDOM COPOLYMERS, THEIR PRODUCTION AND USE

(71) Applicant: AZ ELECTRONIC MATERIALS (LUXEMBOURG) S.A.R.L., Luxembourg (LU)

(72) Inventors: Ralf Grottenmueller, Wiesbaden (DE); Abraham Casas Garcia-Minguillan, Wiesbaden (DE); Fumio Kita, Wiesbaden (DE)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 165 days.

(21) Appl. No.: 16/077,870

(22) PCT Filed: Jan. 19, 2017

(86) PCT No.: PCT/EP2017/000059
§ 371 (c)(1),
(2) Date: Aug. 14, 2018

(87) PCT Pub. No.: WO2017/140407
PCT Pub. Date: Aug. 24, 2017

(65) Prior Publication Data
US 2020/0255599 A1    Aug. 13, 2020

(30) Foreign Application Priority Data

Feb. 15, 2016    (EP) .................................... 16000371

(51) Int. Cl.
| | |
|---|---|
| *H01L 23/29* | (2006.01) |
| *C08L 83/14* | (2006.01) |
| *C08G 77/54* | (2006.01) |
| *C08G 77/04* | (2006.01) |
| *C08G 77/06* | (2006.01) |
| *C08G 77/12* | (2006.01) |
| *H01L 33/56* | (2010.01) |
| *F21Y 115/10* | (2016.01) |

(52) U.S. Cl.
CPC ........... *C08G 77/54* (2013.01); *C08G 77/045* (2013.01); *C08G 77/06* (2013.01); *C08G 77/12* (2013.01); *C08L 83/14* (2013.01); *H01L 23/296* (2013.01); *H01L 33/56* (2013.01); *C08K 2201/00* (2013.01); *F21Y 2115/10* (2016.08); *H01L 2933/005* (2013.01)

(58) Field of Classification Search
CPC ..... C08G 77/54; C08G 77/485; H01L 23/296; H01L 33/56
See application file for complete search history.

(56) References Cited

U.S. PATENT DOCUMENTS

| | | | |
|---|---|---|---|
| 4,678,688 A * | 7/1987 | Itoh | C08J 7/0427 427/387 |
| 6,011,167 A * | 1/2000 | Tashiro | C04B 35/589 556/410 |
| 9,368,746 B2 | 6/2016 | Lee et al. | |
| 10,421,841 B2 * | 9/2019 | Grottenmuller | C08K 5/5406 |
| 2002/0165319 A1 | 11/2002 | Knasiak et al. | |
| 2006/0160014 A1 | 7/2006 | Nagahara et al. | |
| 2012/0177829 A1 | 7/2012 | Lim | |
| 2015/0188006 A1 | 7/2015 | Williams | |
| 2017/0107401 A1 | 4/2017 | Fish | |

FOREIGN PATENT DOCUMENTS

| | | |
|---|---|---|
| CN | 104812543 A | 7/2015 |
| EP | 2200106 B1 | 11/2013 |
| JP | 60145815 A2 | 8/1985 |
| JP | 4136278 A | 5/1992 |
| JP | 2004077874 A | 3/2004 |
| WO | 2002068535 A1 | 9/2002 |

OTHER PUBLICATIONS

International Search Report PCT/EP2017/000059 dated Mar. 13, 2017.(2 pages).
Notice of Reasons for Refusal in corresponding Japanese Patent Application No. 2018-544039 Date of Drafting: Oct. 28, 2020 (pp. 1-5).
Office Action in corresponding CN application 201780010344.2 dated Sep. 30, 2020 (pp. 1-5).

* cited by examiner

*Primary Examiner* — Marc S Zimmer
(74) *Attorney, Agent, or Firm* — Millen White Zelano and Branigan, PC; John Sopp

(57) ABSTRACT

The present invention relates to silazane-siloxane random copolymers as well as their production and their uses, particularly in LEDs.

17 Claims, No Drawings

SILAZANE-SILOXANE RANDOM COPOLYMERS, THEIR PRODUCTION AND USE

TECHNICAL FIELD

The present invention relates to silazane-siloxane random copolymers as well as their production and their uses, particularly in LEDs.

BACKGROUND AND DESCRIPTION OF THE PRIOR ART

In recent years the electronic industry has seen the rapid replacement of conventional technologies that have been in use for several decades without major improvements.

One such example is the conventional incandescent light bulb being replaced by light emitting diodes (LEDs). The lifetime of incandescent light bulbs is generally on the order of a few thousand hours, while LEDs claim lifetimes of several tens of thousands of hours. These long lifetimes are only made possible if the light emitting materials in an LED can effectively be protected from degradation by environmental factors, such as oxygen and moisture. Frequently this is done by encapsulating the LED in a polymer. However, such encapsulating polymers need to fulfill a number of further requirements:

The polymer has to withstand high temperatures without degradation of mechanical and/or optical properties;
in addition to optical clarity and high service temperature the polymer needs to have a high refractive index;
the polymer is required to have a high resistance to radiation of high intensity; and
there is a need for polymers that can be varied in elastic modulus from being very soft to hard.

Recently polysilazane/polysiloxane copolymers have been proposed in US 2015/0188006 A1 as encapsulation polymers.

Such copolymers are for example disclosed in WO 02/068535 A1.

However, these polymers as well as their methods of production still leave room for improvement, particularly in respect to the balance between mechanical properties and thermal and/or light stability. While they show good thermal and light stability, current polysilazanes tend, for example, towards severe crack formation, particularly the formation of micro-cracks, and also exhibit limited compatibility with additives.

It is therefore an object of the present application to provide for a polymer with improved properties, particularly with improved properties in LED applications.

It is also an object of the present application to provide for a method for producing such polymers with improved properties.

Furthermore, it is an object of the present application to provide for a flexible and versatile method that can easily be up-scaled to industrial scale and/or allows easy production of tailor-made polymers.

SUMMARY OF THE INVENTION

The present inventors have now surprisingly found that the above objects may be attained either individually or in any combination by the polymer and process of the present application.

The present application therefore provides for a polymer comprising a first monomer unit $M^1$ and a second monomer unit $M^2$ in random sequence, wherein the first monomer unit $M^1$ is of formula (I) and the second monomer unit $M^2$ is of formula (II)

$$—[—SiR^1R^2—NR^5—]— \quad (I)$$

$$—[—SiR^3R^4[—O—SiR^3R^4—]_a—NR^5—]— \quad (II)$$

wherein
$R^1$, $R^2$, $R^3$, $R^4$ and $R^5$ are at each occurrence independently of each other selected from the group consisting of H and carbyl; and
a is an integer of at least 1 and at most 10.

The present application therefore provides for a method comprising the step of obtaining a silazane-siloxane random copolymer by reacting an organosilane, an amine and an organosiloxane, wherein the organosilane comprises two halogen end groups and the organosiloxane is of formula (II-a)

$$X^3—[SiR^3R^4—O—]_a—SiR^3R^4—X^4 \quad (II-a)$$

and the amine is of formula (III)

$$NH_2R^5 \quad (III)$$

wherein
$X^3$ and $X^4$ are identical and are at each occurrence independently selected from the group consisting of OH, CI, Br, I;
$R^3$, $R^4$ and $R^5$ are at each occurrence independently H or a carbyl group; and
a is an integer of at least 1 and at most 10.

DETAILED DESCRIPTION OF THE INVENTION

For the purposes of the present application the term "organosilane" is used to denote an organyl derivative of a silane, i.e. a silane wherein one or more hydrogen is replaced by the corresponding number of organyl groups.

For the purposes of the present application the term "organosiloxane" is used to denote an organyl derivative of a siloxane, i.e. a siloxane wherein one or more hydrogen is replaced by the corresponding number of organyl groups.

For the purposes of the present application the term "organyl" is used to denote any organic substituent group, regardless of functional type, having one free valence at a carbon atom.

For the purposes of the present application the term "organoheteryl" is used to denote any univalent group containing carbon, which is thus organic, but which has the free valence at an atom other than carbon.

For the purposes of the present application the term "carbyl group" includes both, organyl groups and organoheteryl groups. As used herein, the term "carbyl group" will be understood to mean any monovalent or multivalent organic radical moiety which comprises at least one carbon atom either without any non-carbon atoms (like for example —C≡C—), or optionally comprising one or more heteroatoms (for example carbonyl etc.).

The term "hydrocarbyl group" will be understood to mean a carbyl group that does additionally contain one or more H atoms and optionally contains one or more hetero atoms.

As used herein, the term "hetero atom" will be understood to mean an atom in an organic compound that is not a H- or C-atom, and preferably will be understood to mean N, O, S, P, Si, Se, As, Te or Ge.

A carbyl or hydrocarbyl group comprising a chain of 3 or more C atoms may be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

The terms "aryl" and "heteroaryl" as used herein preferably mean a mono-, bi- or tricyclic aromatic or heteroaromatic group with 4 to 30 ring C atoms that may also comprise condensed rings and is optionally substituted with one or more groups L, wherein L is selected from halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, and is preferably alkyl, alkoxy, thiaalkyl, alkylcarbonyl, alkoxycarbonyl or alkoxycarbonyloxy with 1 to 20 C atoms that is optionally fluorinated, and R$^0$, R$^{00}$, X$^0$, P and Sp have the meanings given above and below.

Very preferred substituents L are selected from halogen, most preferably F, or alkyl, alkoxy, oxaalkyl, thioalkyl, fluoroalkyl and fluoroalkoxy with 1 to 12 C atoms or alkenyl, and alkynyl with 2 to 12 C atoms.

Especially preferred aryl and heteroaryl groups are phenyl, phenyl wherein one or more CH groups are replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b; 4,5-b']dithiophene, benzo[2,1-b; 3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, all of which can be unsubstituted, mono- or polysubstituted with L as defined above. Further examples of aryl and heteroaryl groups are those selected from the groups shown hereinafter.

An alkyl or alkoxy radical, i.e. where the terminal CH$_2$ group is replaced by —O—, can be straight-chain or branched. It is preferably straight-chain (or linear). Suitable examples of such alkyl and alkoxy radical are methyl, ethyl, propyl, butyl, pentyl, hexyl, heptyl, octyl, nonyl, decyl, undecyl, dodecyl, tridecyl, tetradecyl, pentadecyl, methoxy, ethoxy, propoxy, butoxy, pentoxy, hexoxy, heptoxy, octoxy, nonoxy, decoxy, undecoxy, dodecoxy, tridecoxy or tetradecoxy. Preferred alkyl and alkoxy radicals have 1, 2, 3, 4, 5, 6, 7, 8, 9 or 10 carbon atoms. Suitable examples of such preferred alkyl and alkoxy radicals may be selected from the group consisting of methyl, ethyl, propyl, butyl, pentyl, hexyl, heptyl, octyl, nonyl, decyl, methoxy, ethoxy, propoxy, butoxy, pentoxy, hexoxy, heptoxy, octoxy, nonoxy and decoxy.

An alkenyl group, wherein one or more CH$_2$ groups are replaced by —CH=CH— can be straight-chain or branched. It is preferably straight-chain, has 2 to 10 C atoms and accordingly is preferably vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl or non-8-enyl, dec-1-enyl, dec-2-enyl, dec-3-enyl, dec-4-enyl, dec-5-enyl, dec-6-enyl, dec-7-enyl, dec-8-enyl or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

An oxaalkyl group, i.e. where one CH$_2$ group is replaced by —O—, is preferably straight-chain 2-oxapropyl (=methoxymethyl), 2-(ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-,7-, 8- or 9-oxadecyl, for example. Oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-,7-, 8- or 9-oxadecyl, for example.

In an alkyl group wherein one CH$_2$ group is replaced by —O— and one by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxy-carbonylmethyl, 2-(methoxycarbonyl)ethyl, 2-(ethoxycarbonyl)ethyl, 2-(propoxy-carbonyl)ethyl, 3-(methoxycarbonyl)propyl, 3-(ethoxycarbonyl)propyl, and 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly it is preferably selected from the group consisting of bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, and 5,5-bis-(ethoxycarbonyl)-hexyl.

A thioalkyl group, i.e. where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-thiooctyl), 1-(thiononyl), 1-(thiodecyl), 1-(thioundecyl) or 1-(thiododecyl), wherein preferably the $CH_2$ group adjacent to the $sp^2$ hybridized vinyl carbon atom is replaced.

A fluoroalkyl group is preferably perfluoroalkyl, $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethylhexoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the hydrocarbyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

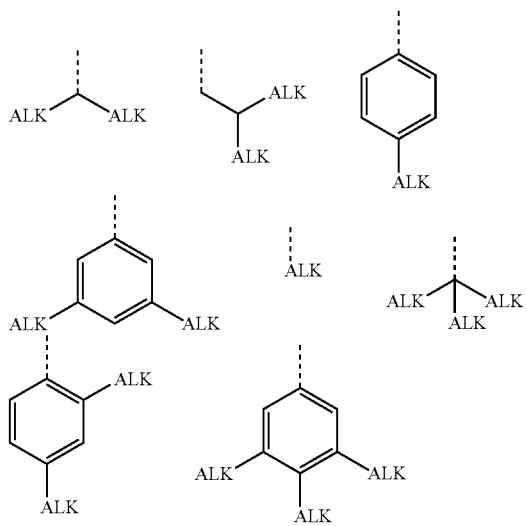

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^2$— is preferably —CH=CH—, —CF=CF— or —CH=C(CN)—.

As used herein, "halogen" includes F, Cl, Br or I, preferably F, Cl or Br.

For the purposes of the present application the term "substituted" is used to denote that one or more hydrogen present is replaced by a group $R^S$ as defined herein.

$R^S$ is at each occurrence independently selected from the group consisting of any group $R^T$ as defined herein, hydrocarbyl having from 1 to 40 carbon atoms wherein the hydrocarbyl may be further substituted with one or more groups $R^T$ and hydrocarbyl having from 1 to 40 carbon atoms comprising one or more heteroatoms selected from the group consisting of N, O, S, P, Si, Se, As, Te or Ge, with N, O and S being preferred heteroatoms, wherein the hydrocarbyl may be further substituted with one or more groups $R^T$.

Preferred examples of hydrocarbyl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5, more preferably at least 10 and most preferably at least 15 carbon atoms and/or has at most 40, more preferably at most 30, even more preferably at most 25 and most preferably at most 20 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)NR$^O$R$^{OO}$, —C(O)X$^O$, —C( )R$^O$, —NH$_2$, —NR$^O$R$^{OO}$, —SH, —SR$^O$, —SO$_3$H, —SO$_2$R$^O$, —OH, —OR$^O$, —NO$_2$, —SF$_5$ and —SiR$^O$R$^{OO}$R$^{OOO}$. Preferred $R^T$ are selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —OH, —OR$^O$ and —SiR$^O$R$^{OO}$R$^{OOO}$.

$R^O$, $R^{OO}$ and $R^{OOO}$ are at each occurrence independently of each other selected from the group consisting of H, F, hydrocarbyl having from 1 to 40 carbon atoms. Said hydrocarbyl preferably have at least 5, more preferably at least 10 and most preferably at least 15 carbon atoms. Said hydrocarbyl preferably have at most 30, even more preferably at most 25 and most preferably at most 20 carbon atoms. Preferably, $R^O$, $R^{OO}$ and $R^{OOO}$ are at each occurrence independently of each other selected from the group consisting of H, F, alkyl, fluorinated alkyl, alkenyl, alkynyl, phenyl and fluorinated phenyl. More preferably, $R^O$, $R^{OO}$ and $R^{OOO}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^O$, $R^{OO}$ and $R^{OOO}$ also includes perfluorinated alkyl, i.e. alkyl wherein all of the hydrogen are replaced by fluorine. Examples of alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—C$_{20}$H$_{41}$).

$X^O$ is halogen. Preferably $X^O$ is selected from the group consisting of F, Cl and Br.

The present application is directed to a polymer, herein generally referred to as "silazane-siloxane random copolymer", comprising a first monomer unit $M^1$ and a second monomer unit $M^2$ in random sequence.

Said first monomer unit $M^1$ is of formula (I)

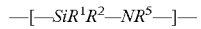 (I)

wherein $R^1$, $R^2$ and $R^5$ are as defined herein.
Said second monomer unit $M^2$ is of formula (II)

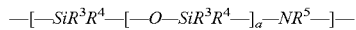 (II)

wherein $R^3$, $R^4$, $R^5$ and a are as defined herein.

a is an integer of at least 1 and of at most 10. For example, a may be any one of the group consisting of 1, 2, 3, 4, 5, 6, 7, 8, 9 and 10.

$R^1$, $R^2$, $R^3$, $R^4$ and $R^5$ are at each occurrence independently H or a carbyl group, preferably H or a carbyl group as defined above.

With respect to $R^1$, $R^2$, $R^3$, $R^4$ and $R^5$ preferred carbyl groups may at each occurrence independently be selected from the group consisting of alkyl, substituted alkyl, cycloalkyl, substituted cycloalkyl, alkenyl, substituted alkenyl, alkadienyl, substituted alkadienyl, aryl, and substituted aryl.

With respect to $R^1$, $R^2$, $R^3$, $R^4$ and $R^5$ more preferred carbyl groups may at each occurrence independently be selected from the group consisting of alkyl, substituted alkyl, cycloalkyl, substituted cycloalkyl, alkenyl, substituted alkenyl, alkadienyl and substituted alkadienyl.

With respect to $R^1$, $R^2$, $R^3$, $R^4$ and $R^5$ even more preferred carbyl groups may at each occurrence independently be selected from the group consisting of alkyl, substituted alkyl, alkenyl, substituted alkenyl, alkadienyl and substituted alkadienyl.

With respect to $R^1$, $R^2$, $R^3$, $R^4$ and $R^5$ still even more preferred carbyl groups may at each occurrence independently be selected from the group consisting of alkyl and substituted alkyl.

With respect to $R^1$, $R^2$, $R^3$, $R^4$ and $R^5$ most preferred carbyl groups may at each occurrence independently be selected from the group consisting of alkyl.

With respect to $R^1$, $R^2$, $R^3$, $R^4$ and $R^5$ preferred alkyl may be selected from alkyls having at least 1 carbon atom and at most 40 carbon atoms, preferably at most 30 or 20 carbon atoms, more preferably at most 15 carbon atoms, still even more preferably at most 10 carbon atoms and most preferably at most 5 carbon atoms.

With respect to $R^1$, $R^2$, $R^3$, $R^4$ and $R^5$ alkyl having at least 1 carbon atom and at most 5 carbon atoms may, for example, independently be selected from the group consisting of methyl, ethyl, n-propyl, iso-propyl, n-butyl, iso-butyl, tert-butyl, n-pentyl, iso-pentyl (2,2-methyl-butyl) and neo-pentyl (2,2-dimethyl-propyl); preferably from the group consisting of methyl, ethyl, n-propyl and iso-propyl; more preferably is methyl or ethyl; and most preferably is methyl.

With respect to $R^1$, $R^2$, $R^3$, $R^4$ and $R^5$ preferred cycloalkyl may be selected from cycloalkyl having at least 3, preferably at least 4 and most preferably at least 5 carbon atoms. With respect to $R^1$ and $R^2$ preferred cycloalkyl may be selected from cycloalkyl having at most 30, preferably at most 25, more preferably at most 20, even more preferably at most 15, and most preferably at most 10 carbon atoms.

With respect to $R^1$, $R^2$, $R^3$, $R^4$ and $R^5$ preferred examples of cycloalkyl may be selected from the group consisting of cyclopentyl, cyclohexyl, cycloheptyl and cyclooctyl.

With respect to $R^1$, $R^2$, $R^3$, $R^4$ and $R^5$ preferred alkenyl may be selected from alkenyl having at least 2 carbon atoms and at most 20, more preferably at most 15, even more preferably at most 10, and most preferably at most 6 carbon atoms. Said alkenyl may comprise the C═C double bond at any position within the molecule; for example, the C═C double bond may be terminal or non-terminal.

With respect to $R^1$, $R^2$, $R^3$, $R^4$ and $R^5$ alkenyl having at least 2 and at most 10 carbon atoms may be vinyl or allyl, preferably vinyl.

With respect to $R^1$, $R^2$, $R^3$, $R^4$ and $R^5$ preferred alkadienyl may be selected from alkadienyl having at least 4 and at most 20, more preferably at most 15, even more preferably at most 10, and most preferably at most 6 carbon atoms. Said alkenyl may comprise the two C═C double bonds at any position within the molecule, provided that the two C═C double bonds are not adjacent to each other; for example, the C═C double bonds may be terminal or non-terminal.

With respect to $R^1$, $R^2$, $R^3$, $R^4$ and $R^5$ alkadienyl having at least 4 and at most 6 carbon atoms may, for example, be butadiene or hexadiene.

With respect to $R^1$, $R^2$, $R^3$, $R^4$ and $R^5$ preferred aryl may be selected from aryl having at least 6 carbon atoms, and at most 30, preferably at most 24 carbon atoms.

With respect to $R^1$, $R^2$, $R^3$, $R^4$ and $R^5$ preferred examples of aryl may be selected from the group consisting of phenyl, naphthyl, phenanthrenyl, anthracenyl, tetracenyl, benz[a]anthracenyl, pentacenyl, chrysenyl, benzo[a]pyrenyl, azulenyl, perylenyl, indenyl, fluorenyl and any of these wherein one or more (for example 2, 3 or 4) CH groups are replaced by N. Of these phenyl, naphthyl and any of these wherein one or more (for example 2, 3 or 4) CH groups are replaced by N. Phenyl is most preferred.

Preferably the present silazane-siloxane random copolymers have a molecular weight $M_w$, as determined by GPC, of at least 1,000 g/mol, more preferably of at least 2,000 g/mol, even more preferably of at least 3,000 g/mol.

If need be, the molecular weight of the present silazane-siloxane random copolymers may be modified, preferably increased, by fluoride-catalyzed crosslinking or by base-catalyzed crosslinking. These methods are well known to the skilled person. Further details can be found in the examples.

The present silazane-siloxane random copolymers are characterized by excellent temperature resistance and/or longevity as compared to currently used standard materials, such as phenylsilicone or organopolysilazanes. Without wishing to be bound by theory, the improved performance of the present silazane-siloxane random copolymers is believed to be due to their specific random structure, which avoids the formation of rigid regions and thereby is believed to lead to a reduction in the formation of cracks, particularly microcracks.

The present application is also directed to a method comprising the step of obtaining the silazane-siloxane random copolymer as defined herein by reacting one or more organosilane, an amine and one or more organosiloxane.

The one or more organosilane comprises two halogen end groups, i.e. is an α,ω-dihalo-organosilane. The end groups may be the same or different; preferably they are the same. Preferably the two halogen end groups are both Cl.

Preferably said organosilane is of formula (I-a)

$$X^1\text{—}SiR^1R^2\text{—}X^2 \qquad (\text{I-a})$$

wherein $R^1$, $R^2$, $X^1$ and $X^2$ are as defined herein.

$X^1$ and $X^2$ are at each occurrence independently of each other selected from the group consisting of Cl, Br, I. Preferably $X^1$ and $X^2$ are Cl.

The organosiloxane comprises two halogen end groups, preferably two Cl end groups, or two hydroxy (—OH) end groups.

Preferably said organosiloxane is of formula (II)

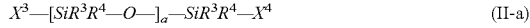

$$X^3\text{—}[SiR^3R^4\text{—}O\text{—}]_a\text{—}SiR^3R^4\text{—}X^4 \qquad (\text{II-a})$$

wherein a, $X^3$, $X^4$, $R^3$ and $R^4$ are as defined herein.

a is an integer of at least 1 and of at most 10. For example, a may be any one of the group consisting of 1, 2, 3, 4, 5, 6, 7, 8, 9 and 10.

$X^3$ and $X^4$ are identical and are at each occurrence independently preferably selected from the group consisting of Cl, Br, I and OH, more preferably are Cl or OH.

Preferably said amine is of formula (III)

$$NH_2R^5 \qquad (\text{III})$$

with $R^5$ as defined herein. Preferable $R^5$ is H or methyl, most preferably H.

It is noted that said amine may also be a blend of amines with different groups $R^5$.

Preferred methods of obtaining a silazane-siloxane random copolymer in accordance with the present application may, for example, be represented by the following Routes (A) and (B)

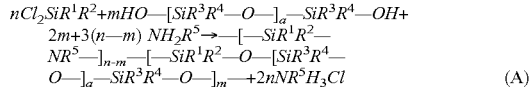

$$nCl_2SiR^1R^2 + mHO\text{—}[SiR^3R^4\text{—}O\text{—}]_a\text{—}SiR^3R^4\text{—}OH +$$
$$2m+3(n-m) NH_2R^5 \rightarrow [\text{—}SiR^1R^2\text{—}$$
$$NR^5\text{—}]_{n-m}\text{—}[\text{—}SiR^1R^2\text{—}O\text{—}[SiR^3R^4\text{—}$$
$$O\text{—}]_a\text{—}SiR^3R^4\text{—}O\text{—}]_m + 2nNR^5H_3Cl \qquad (\text{A})$$

with n≥m,

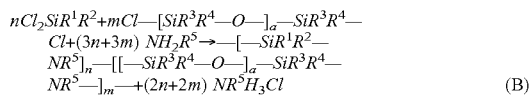

$$nCl_2SiR^1R^2 + mCl\text{—}[SiR^3R^4\text{—}O\text{—}]_a\text{—}SiR^3R^4\text{—}$$
$$Cl + (3n+3m) NH_2R^5 \rightarrow [\text{—}SiR^1R^2\text{—}$$
$$NR^5]_n\text{—}[[\text{—}SiR^3R^4\text{—}O\text{—}]_a\text{—}SiR^3R^4\text{—}$$
$$NR^5\text{—}]_m + (2n+2m) NR^5H_3Cl \qquad (\text{B})$$

The conditions for reacting the organosilane, the amine and the organosiloxane are not particularly limited. It is, however, preferred to conduct the reaction within specific ranges of conditions, for example, in respect to temperature and solvent. Preferably said solvent is an aprotic organic solvent such as a hydrocarbon, an aromatic compound, an ester or an ether. Examples of such solvents are n-heptane, cyclohexane, xylene, pyridine, tetrahydrofuran, 1,4-dioxane, methyl-acetate or ethyl-acetate.

Preferably the present reaction is performed at a temperature of at least −30° C. and of at most 120° C., more preferably of at least −20° C. and of at most 110° C. and most preferably of at least −10° C. and of at most 100° C.

Another preferred synthetic method is to perform the reaction in liquid amine, for example in liquid ammonia. Then the amine is solvent and reactant at the same time. If liquid ammonia is used, the preferred reaction conditions are a temperature of at least −20° C. and of at most 40° C. and a pressure of at most 20 bar.

The present application is also directed to a method for producing an electronic device, said process, in addition to the step of reacting the organosilane, the amine and the organosiloxane thus obtaining a silazane-siloxane random copolymer, comprising the steps of providing a composition comprising the so-obtained silazane-siloxane random copolymer and applying it to a substrate in an electronic device.

Preferably, the method for producing an electronic device thus comprises the steps of (a) obtaining a silazane-siloxane random copolymer by reacting an organosilane, ammonia or an amine and an organosiloxane, (b) providing a composition comprising the silazane-siloxane random copolymer obtained in step (a), and (c) subsequently depositing said composition on a substrate.

Preferably, in addition to the silazane-siloxane random copolymer, said composition further comprises one or more selected from the group consisting of light emitting material, viscosity modifier, surfactant, additive influencing film formation, additive influencing evaporation behavior, crosslinker and solvent. Most preferably, said composition further comprises a light emitting material.

Preferably, said light emitting material is a phosphor, i.e. a substance that has luminescent properties. The term "luminescent" is intended to include both, phosphorescent as well as fluorescent.

For the purposes of the present application, the type of phosphor is not particularly limited. Suitable phosphors are well known to the skilled person and can easily be obtained from commercial sources. For the purposes of the present application the term "phosphor" is intended to include materials that absorb in one wavelength of the electromagnetic spectrum and emit at a different wavelength.

Examples of suitable phosphors are inorganic fluorescent materials in particle form comprising one or more emitting centers. Such emitting centers may, for example, be formed by the use of so-called activators, which are preferably atoms or ions selected from the group consisting of rare earth elements, transition metal elements, main group elements and any combination of any of these. Example of suitable rare earth elements may be selected from the group consisting of La, Ce, Pr, Nd, Pm, Sm, Eu, Gd, Tb, Dy, Ho, Er, Tm, Yb and Lu. Examples of suitable transition metal elements may be selected from the group consisting of Cr, Mn, Fe, Co, Ni, Cu, Ag, Au and Zn. Examples of suitable main group elements may be selected from the group consisting of Na, Tl, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminumsilicate, oxonitridosilicate, oxonitridoaluminumsilicate and rare earth doped sialon.

Suitable yellow phosphors may, for example, comprise or be based on $(Gd,Y)_3(Al, Ga)_5O_{12}$ doped with Ce, such as the commercially available cerium-doped yttrium aluminum garnet (frequently abbreviated as "Ce:YAG" or "YAG:Ce"); or $Th_{3-x}M_xO_{12}$:Ce (TAG) ($0 \leq x \leq 3$) with M being selected from the group consisting of Y, Gd, La and Lu; or $Sr_{2-x-y}Ba_xCa_ySiO_4$:EU ($0 \leq x \leq 2$; and $0 \leq y \leq 2$).

Examples of green phosphors may be selected from the group of $SrGa_2S_4$:Eu; $Sr_{2-y}Ba_ySiO_4$:Eu ($0 \leq y \leq 2$) and/or $SrSi_2O_2N_2$:Eu.

Examples of suitable phosphors may be selected from the following: $Ba_2SiO_4$:$Eu^{2+}$, $BaSi_2O_5$:$Pb^{2+}$, $Ba_xSr_{1-x}F_2$:$Eu^{2+}$ ($0 \leq x \leq 1$), $BaSrMgSi_2O_7$:$Eu^{2+}$, $BaTi P_2O_7$, $(Ba,Ti)_2P_2O_7$:Ti, $Ba_3WO_6$:U, $BaY_2F_8$:$Er^{3+}$,$Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+}$, $Mn^{2+}$, $CaAl_2O_4$:$Tb^{3+}$, $Ca_3Al_2Si_3O_{12}$:$Ce^{3+}$, $Ca_3Al_2Si_3Oi_2$:$Ce^{3+}$, $Ca_3Al_2Si_3O_2$:$Eu^{2+}$, $Ca_2B_6O_9Br$:$Eu^{2+}$, $Ca_2B_6O_9Cl$:$Eu^{2+}$, $Ca_2B_5O_9Cl$:$Pb^{2+}$, $CaB_2O_4$:$Mn^{2+}$, $Ca_2B_2O_6$:$Mn^{2+}$, $CaB_2O_4$:$Pb^{2+}$, $CaB_2P_2O_9$:$Eu^{2+}$, $Ca_5B_2SiO_{10}$:$Eu^{3+}$, $Ca_{0.5}Ba_{0.5}Al_{12}O_{19}$:$Ce^{3+}$,$Mn^{2+}$, $Ca_2Ba_3(PO_4)_3Cl$:$Eu^{2+}$, $CaBr_2$:$Eu^{2+}$ in $SiO_2$, $CaCl_2$:$Eu^{2+}$ in $SiO_2$, $CaCl_2$:$Eu^{2+}$,$Mn^{2+}$ in $SiO_2$, $CaF_2$:$Ce^{3+}$, $CaF_2$:$Ce^{3+}$,$Mn^{2+}$, $CaF_2$:$Ce^{3+}$,$Tb^{3+}$, $CaF_2$:$Eu^{2+}$, $CaF_2$:$Mn^{2+}$, $CaF_2$:U, $CaGa_2O_4$:$Mn^{2+}$, $CaGa_4O_7$:$Mn^{2+}$, $CaGa_2S_4$:$Ce^{3+}$, $CaGa_2S_4Eu^{2+}$, $CaGa_2S_4$:$Mn^{2+}$, $CaGa_2S_4$:$Pb^{2+}$, $CaGeO_3$:$Mn^{2+}$, $CaI_2$:$Eu^{2+}$ in $SiO_2$, $CaI_2$:$Eu^{2+}$,$Mn^{2+}$ in $SiO_2$, $CaLaBO_4$:$Eu^{3+}$, $CaLaB_3O_7$:$Ce^{3+}$,$Mn^{2+}$, $Ca_2La_2BO_{6.5}$:$Pb^{2+}$, $Ca_2MgSi_2O_7$, $Ca_2MgSi_2O_7$:$Ce^{3+}$, $CaMgSi_2O_6$:$Eu^{2+}$, $Ca_3MgSi_2O_8$:$Eu^{2+}$, $Ca_2MgSi_2O_7$:$Eu^{2+}$, $CaMgSi_2O_6$:$Eu^{2+}$,$Mn^{2+}$, $Ca_2MgSi_2O_7$:$Eu^{2+}$,$Mn^{2+}$, $CaMoO_4$, $CaMoO_4$:$Eu^{3+}$, $CaO$:$Bi^{3+}$, $CaO$:$Cd^{2+}$, $CaO$:$Cu^+$, $CaO$:$Eu^{3+}$, $CaO$:$Eu^{3+}$, $Na^+$, $CaO$:$Mn^{2+}$, $CaO$:$Pb^{2+}$, $CaO$:$Sb^{3+}$, $CaO$:$Sm^{3+}$, $CaO$:$Tb^{3+}$, $CaO$:Tl, $CaO$:$Zn^{2+}$, $Ca_2P_2O_7$:$Ce^{3+}$, $\alpha$-$Ca_3(PO_4)_2$:$Ce^{3+}$, $\beta$-$Ca_3(PO_4)_2$:$Ce^{3+}$, $Ca_5(PO_4)_3Cl$:$Eu^{2+}$, $Ca_5(PO_4)_3Cl$:$Mn^{2+}$, $Ca_5(PO_4)_3Cl$:$Sb^{3+}$, $Ca_5(PO_4)_3Cl$:$Sn^{2+}$, $\beta$-$Ca_3(PO_4)_2$:$Eu^{2+}$,$Mn^{2+}$, $Ca_6(PO_4)_3F$:$Mn^{2+}$, $Ca_s(PO_4)_3F$:$Sb^{3+}$, $Ca_s(PO_4)_3F$:$Sn^{2+}$, $\alpha$-$Ca_3(PO_4)_2$:$Eu^{2+}$, $\beta$-$Ca_3(PO_4)_2$:$Eu^{2+}$, $Ca_2P_2O_7$:$Eu^{2+}$, $Ca_2P_2O_7$:$Eu^{2+}$, $Mn^{2+}$, $CaP_2O_6$:$Mn^{2+}$, $\alpha$-$Ca_3(PO_4)_2$:$Pb^{2+}$, $\alpha$-$Ca_3(PO_4)_2$:$Sn^{2+}$, $\beta$-$Ca_3(PO_4)_2$:$Sn^{2+}$, $\beta$-$Ca_2P_2O_7$:Sn,Mn, $\alpha$-$Ca_3(PO_4)_2$:Tr, $CaS$:$Bi^{3+}$, $CaS$:$Bi^{3+}$,Na, $CaS$:$Ce^{3+}$, $CaS$:$Eu^{2+}$, $CaS$:$Cu^+$,$Na^+$, $CaS$:$La^{3+}$, $CaS$:$Mn^{2+}$, $CaSO_4$:Bi, $CaSO_4$:$Ce^{3+}$, $CaSO_4$:$Ce^{3+}$,$Mn^{2+}$, $CaSO_4$:$Eu^{2+}$, $CaSO_4$:$Eu^{2+}$,$Mn^{2+}$, $CaSO_4$:$Pb^{2+}$, $CaS$:$Pb^{2+}$, $CaS$:$Pb^{2+}$,Cl, $CaS$:$Pb^{2+}$,$Mn^{2+}$, $CaS$:$Pr^{3+}$,$Pb^{2+}$,Cl, $CaS$:$Sb^{3+}$, $CaS$:$Sb^{3+}$,Na, $CaS$:$Sm^{3+}$, $CaS$:$Sn^{2+}$, $CaS$:$Sn^{2+}$,F, $CaS$:$Tb^{3+}$, $CaS$:$Tb^{3+}$,Cl, $CaS$:$Y^{3+}$, $CaS$:$Yb^{2+}$, $CaS$:$Yb^{2+}$,Cl, $CaSiO_3$:$Ce^{3+}$, $Ca_3SiO_4Cl_2$:$Eu^{2+}$, $Ca_3SiO_4Cl_2$:$Pb^{2+}$, $CaSiO_3$:$Eu^{2+}$, $CaSiO_3$:$Mn^{2+}$,Pb, $CaSiO_3$:$Pb^{2+}$, $CaSiO_3$:$Pb^{2+}$,$Mn^{2+}$, $CaSiO_3$:$Ti^{4+}$, $CaSr_2(PO_4)_2$:$Bi^{3+}$, $\beta$-$(Ca,Sr)_3(PO_4)_2$:$Sn^{2+}Mn^{2+}$, $CaTi_{0.9}Al_{0.1}O_3$:$Bi^{3+}$, $CaTiO_3$:$Eu^{3+}$, $CaTiO_3$:$Pr^{3+}$, $Ca_5(VO_4)_3Cl$, $CaWO_4$, $CaWO_4$:$Pb^{2+}$, $CaWO_4$:W, $Ca_3WO_6$:U, $CaYAlO_4$:$Eu^{3+}$, $CaYBO_4$:$Bi^{3+}$, $CaYBO_4$:$Eu^{3+}$, $CaYB_{0.8}O_{3.7}$:$Eu^{3+}$, $CaY_2ZrO_6$:$Eu^{3+}$, $(Ca,Zn,Mg)_3(PO_4)_2$:Sn, Ce $F_3$, (Ce,Mg)$BaAl_{11}O_{18}$:Ce, (Ce,Mg)$SrAl_{11}O_{18}$:Ce, $CeMgAl_{11}O_{19}$:Ce:Tb, $Cd_2B_6O_{11}$:$Mn^{2+}$, $CdS$:$Ag^+$,Cr, $CdS$:In, $CdS$:In, $CdS$:In,Te, $CdS$:Te, $CdWO_4$, CsF, CsI, $CsI$:$Na^+$, $CsI$:Tl, $(ErCl_3)_{0.25}(BaCl_2)_{0.75}$, GaN:Zn, $Gd_3Ga_5O_{12}$:$Cr^{3+}$, $Gd_3Ga_5O_{12}$:Cr,Ce, $GdNbO_4$:$Bi^{3+}$, $Gd_2O_2S$:$Eu^{3+}$, $Gd_2O_2Pr^{3+}$, $Gd_2O_2S$:Pr,Ce,F, $Gd_2O_2S$:$Tb^{3+}$, $Gd_2SiO_5$:$Ce^{3+}$, $KAl_{11}O_{17}$:$Tl^+$, $KGa_{11}O_{17}$:$Mn^{2+}$, $K_2La_2Ti_3O_{10}$:Eu, $KMgF_3$:$Eu^{2+}$, $KMgF_3$:$Mn^{2+}$, $K_2SiF_6$:$Mn^{4+}$, $LaAl_3B_4O_{12}$:$Eu^{3+}$, $LaAlB_2O_6$:$Eu^{3+}$, $LaAlO_3$:$Eu^{3+}$, $LaAlO_3$:$Sm^{3+}$, $LaAsO_4$:$Eu^{3+}$, $LaBr_3$:$Ce^{3+}$, $LaBO_3$:$Eu^{3+}$, $(La,Ce,Tb)PO_4$:Ce:Tb, $LaCl_3$:$Ce^{3+}$, $La_2O_3$:$Bi^{3+}$, $LaOBr$:$Tb^{3+}$, $LaOBr$:$Tm^{3+}$, $LaOCl$:$Bi^{3+}$, $LaOCl$:$Eu^{3+}$, $LaOF$:$Eu^{3+}$, $La_2O_3$:$Eu^{3+}$, $La_2O_3$:$Pr^{3+}$, $La_2O_2S$:$Tb^{3+}$, $LaPO_4$:$Ce^{3+}$, $LaPO_4$:$Eu^{3+}$, $LaSiO_3Cl$:$Ce^{3+}$, $LaSiO_3Cl$:$Ce^{3+}$,$Tb^{3+}$, $LaVO_4$:$Eu^{3+}$, $La_2W_3O_{12}$:$Eu^{3+}$, $LiAlF_4$:$Mn^{2+}$, $LiAl_5O_8$:$Fe^{3+}$, $LiAlO_2$:$Fe^{3+}$, $LiAlO_2$:$Mn^{2+}$, $LiAl_5O_8$:$Mn^{2+}$, $Li_2CaP_2O_7$:$Ce^{3+}$,$Mn^{2+}$, $LiCeBa_4Si_4O_{14}$:$Mn^{2+}$, $LiCeSrBa_3Si_4O_{14}$:$Mn^{2+}$, $LiInO_2$:$Eu^{3+}$, $LiInO_2$:$Sm^{3+}$, $LiLaO_2$:$Eu^{3+}$, $LuAlO_3$:$Ce^{3+}$, $(Lu,Gd)_2SiO_5$:$Ce^{3+}$, $Lu_2SiO_5$:$Ce^{3+}$, $Lu_2Si_2O_7$:$Ce^{3+}$, $LuTaO_4$:$Nb^{5+}$, $Lu_{1-x}Y_xAlO_3$:$Ce^{3+}$($0 \leq x \leq 1$), $MgAl_2O_4$:$Mn^{2+}$, $MgSrAl_{10}O_{17}$:Ce, $MgB_2O_4$:$Mn^{2+}$, $MgBa_2(PO_4)_2$:$Sn^{2+}$, $MgBa_2(PO_4)_2$:U, $MgBaP_2O_7$:$Eu^{2+}$, $MgBaP_2O_7$:$Eu^{2+}$,$Mn^{2+}$, $MgBa_3Si_2O_8$:$Eu^{2+}$, $MgBa(SO_4)_2$:$Eu^{2+}$, $Mg_3Ca(PO_4)_4$:$Eu^{2+}$, $MgCaP_2O_7$:$Mn^{2+}$, $Mg_2Ca(SO_4)_3$:$Eu^{2+}$, $Mg_2Ca(SO_4)_3$:$Eu^{2+}$,$Mn^2$, $MgCeAl_nO_{19}$:$Tb^{3+}$, $Mg_4(F)GeO_6$:$Mn^{2+}$, $Mg_4(F)(Ge,Sn)O_6$:$Mn^{2+}$, $MgF_2$:$Mn^{2+}$, $MgGa_2O_4$:$Mn^{2+}$, $Mg_8Ge_2O_{11}F_2$:$Mn^{4+}$, $MgS$:$Eu^{2+}$, $MgSiO_3$:$Mn^{2+}$, $Mg_2SiO_4$:$Mn^{2+}$, $Mg_3SiO_3F_4$:$Ti^{4+}$, $MgSO_4$:$Eu^{2+}$, $MgSO_4$:$Pb^{2+}$, $MgSrBa_2Si_2O_7$:$Eu^{2+}$, $MgSrP_2O_7$:$Eu^{2+}$, $MgSr_5(PO_4)_4$:$Sn^{2+}$, $MgSr_3Si_2O_8$:$Eu^{2+}$,$Mn^{2+}$, $Mg_2Sr(SO_4)_3$:$Eu^{2+}$, $Mg_2TiO_4$:$Mn^{4+}$, $MgWO_4$, $MgYBO_4$:$Eu^{3+}$, $Na_3Ce(PO_4)_2$:$Tb^{3+}$, NaI:Tl, $Na_{1.23}K_{0.42}Eu_{0.12}TiSi_4O_{11}$:$Eu^{3+}$, $Na_{1.23}K_{0.42}Eu_{0.12}TiSi_5O_{13}$.$xH_2O$:$Eu^{3+}$, $Na_{1.29}K_{0.46}Er_{0.08}TiSi_4O_{11}$:$Eu^{3+}$, $Na_2Mg_3Al_2Si_2O_{10}$:Tb, $Na(Mg_2,Mn_x)LiSi_4O_{10}F_2$:Mn ($0 \leq x \leq 2$), $NaYF_4$:$Er^{3+}$, $Yb^{3+}$, $NaYO_2$:$Eu^{3+}$, P46(70%)+P47 (30%), $SrAl_{12}O_{19}$:$Ce^{3+}$, $Mn^{2+}$, $SrAl_2O_4$:$Eu^{2+}$, $SrAl_4O_7$:$Eu^{3+}$, $SrAl_{12}O_{19}$:$Eu^{2+}$, $SrAl_2S_4$:$Eu^{2+}$, $Sr_2B_5O_9Cl$:$Eu^{2+}$, $SrB_4O_7$:$Eu^{2+}$(F,Cl,Br), $SrB_4O_7$:$Pb^{2+}$, $SrB_4O_7$:$Pb^{2+}$, $Mn^{2+}$, $SrB_8O_{13}$:$Sm^{2+}$, $Sr_xBa_yCl_zAl_2O_{4-z/2}$:$Mn^{2+}$,$Ce^{3+}$, $SrBaSiO_4$:$Eu^{2+}$, $Sr(Cl,Br,I)_2$:$Eu^{2+}$ in $SiO_2$, $SrCl_2$:$Eu^{2+}$ in $SiO_2$, $Sr_5Cl(PO_4)_3$:Eu, $Sr_wF_xB_4O_{6.5}$:$Eu^{2+}$, $Sr_wF_xB_yO_z$:$Eu^{2+}$,$Sm^{2+}$, $SrF_2$:$Eu^{2+}$, $SrGa_{12}O_{19}$:$Mn^{2+}$, $SrGa_2S_4$:$Ce^{3+}$, $SrGa_2S_4$:$Eu^{2+}$, $SrGa_2S_4$:$Pb^{2+}$, $SrIn_2O_4$:$Pr^{3+}$, $Al^{3+}$, $(Sr,Mg)_3(PO_4)_2$:Sn, $SrMgSi_2O_6$:$Eu^{2+}$, $Sr_2MgSi_2O_7$:$Eu^{2+}$, $Sr_3MgSi_2O_8$:$Eu^{2+}$, $SrMoO_4$:U, $SrO$.$3B_2O_3$:$Eu^{2+}$,Cl, $\beta$-$SrO$.$3B_2O_3$:$Pb^{2+}$, $\beta$-$SrO$.$3B_2O_3$:$Pb^{2+}$,$Mn^{2+}$, $\alpha$-$SrO$.$3B_2O_3$:$Sm^{2+}$, $Sr_6P_5BO_{20}$:Eu, $Sr_5(PO_4)_3Cl$:$Eu^{2+}$, $Sr_5(PO_4)_3Cl$:$Eu^{2+}$,$Pr^{3+}$, $Sr_5(PO_4)_3Cl$:$Mn^{2+}$, $Sr_5(PO_4)_3Cl$:$Sb^{3+}$, $Sr_2P_2O_7$:$EU^{2+}$, $\beta$-$Sr_3(PO_4)_2$:$Eu^{2+}$, $Sr_5(PO_4)_3F$:$Mn^{2+}$, $Sr_5(PO_4)_3F$:$Sb^{3+}$, $Sr_5(PO_4)_3F$:$Sb^{3+}$, $Mn^{2+}$, $Sr_5(PO_4)_3F$:$Sn^{2+}$, $Sr_2P_2O_7$:$Sn^{2+}$, $\beta$-$Sr_3(PO_4)_2$:$Sn^{2+}$, $\beta$-$Sr_3(PO_4)_2$:$Sn^{2+}$,$Mn^{2+}$(Al), $SrS$:$Ce^{3+}$, $SrS$:$Eu^{2+}$, $SrS$:$Mn^{2+}$, $SrS$:$Cu^+$,Na, $SrSO_4$:Bi, $SrSO_4$:$Ce^{3+}$, $SrSO_4$:$Eu^{2+}$, $SrSO_4$:$Eu^{2+}$,$Mn^{2+}$, $Sr_6Si_4O_{10}Cl_6$:$Eu^{2+}$, $Sr_2SiO_4$:$Eu^{2+}$, $SrTiO_3$:$Pr^{3+}$, $SrTiO_3$:$Pr^{3+}$,$Al^{3+}$, $SrY_2O_3$:$Eu^{3+}$, $ThO_2$:$Eu^{3+}$, $ThO_2$:$Pr^{3+}$, $ThO_2$:$Tb^{3+}$, $YAl_3B_4O_{12}$:$Bi^{3+}$, $YAl_3B_4O_{12}$:$Ce^{3+}$, $YAl_3B_4O_{12}$:$Ce^{3\pm}$,Mn, $YAl_3B_4O_{12}$:$Ce^{3+}$,$Tb^{3+}$, $YAl_3B_4O_{12}$:$Eu^{3+}$, $YAl_3B_4O_{12}$:$Eu^{3+}$,$Cr^{3+}$, $YAl_3B_4O_{12}$:$Th^{4+}$,$Ce^{3+}$,$Mn^{2+}$, $YAlO_3$:$Ce^{3+}$, $Y_3Al_6O_{12}$:$Ce^{3+}$, $Y_3Al_6O_{12}$:$Cr^{3+}$, $YAlO_3$:$Eu^{3+}$, $Y_3Al_6O_{12}$:$Eu^{3+}$, $Y_4Al_2O_9$:$Eu^{3+}$, $Y_3Al_6O_{12}$:$Mn^{4+}$, $YAlO_3$:$Sm^{3+}$, $YAlO_3$:$Tb^{3+}$, $Y_3Al_6O_{12}$:$Tb^{3+}$, $YAsO_4$:$Eu^{3+}$, $YBO_3$:$Ce^{3+}$, $YBO_3$:$Eu^{3+}$, $YF_3$:$Er^{3+}$,$Yb^{3+}$, $YF_3$:$Mn^{2+}$, $YF_3$:$Mn^{2+}$,$Th^{4+}$, $YF_3$:$Tm^{3+}$,$Yb^{3+}$, $(Y,Gd)BO_3$:Eu, $(Y,Gd)BO_3$:Tb, $(Y,Gd)_2O_3$:$Eu^{3+}$, $Y_{1.34}Gd_{0.60}O_3(Eu,Pr)$, $Y_2O_3$:$Bi^{3+}$, $YOBrEu^{3+}$, $Y_2O_3$:Ce, $Y_2O_3$:$Er^{3+}$, $Y_2O_3$:$Eu^{3+}$(YOE), $Y_2O_3$:$Ce^{3+}$,$Tb^{3+}$, $YOCl$:$Ce^{3+}$, $YOCl$:$Eu^{3+}$, $YOF$:$Eu^{3+}$, $YOF$:$Tb^{3+}$, $Y_2O_3$:$Ho^{3+}$, $Y_2O_2S$:$Eu^{3+}$, $Y_2O_2S$:$Pr^{3+}$, $Y_2O_2S$:$Tb^{3+}$, $Y_2O_3$:$Tb^{3+}$, $YPO_4$:$Ce^{3+}$, $YPO_4$:$Ce^{3+}$,$Tb^{3+}$, $YPO_4$:$Eu^{3+}$, $YPO_4$:$Mn^{2+}$,$Th^{4+}$, $YPO_4$:$V^{5+}$, $Y(P,V)O_4$:Eu, $Y_2SiO_6$:$Ce^{3+}$, $YTaO_4$, $YTaO_4$:$Nb^{5+}$, $YVO_4$:$Dy^{3+}$, $YVO_4$:$Eu^{3+}$, $ZnAl_2O_4$:$Mn^{2+}$, $ZnB_2O_4$:$Mn^{2+}$, $ZnBa_2S_3$:$Mn^{2+}$, $(Zn,Be)_2SiO_4$:$Mn^{2+}$, $Zn_{0.4}Cd_{0.6}S$:Ag, $Zn_{0.6}Cd_{0.4}S$:Ag, $(Zn,Cd)S$:Ag,Cl, $(Zn,Cd)S$:Cu, $ZnF_2$:$Mn^{2+}$, $ZnGa_2O_4$, $ZnGa_2O_4$:$Mn^{2+}$, $ZnGa_2S_4$:$Mn^{2+}$, $Zn_2GeO_4$:$Mn^{2+}$, $(Zn,Mg)F_2$:$Mn^{2+}$, $ZnMg_2(PO_4)_2$:$Mn^{2+}$, $(Zn,Mg)_3(PO_4)_2$:$Mn^{2+}$, $ZnO$:$Al^{3+}$,$Ga^{3+}$, $ZnO$:$Bi^{3+}$, $ZnO$:$Ga^{3+}$, $ZnO$:Ga, $ZnO$—$CdO$:Ga, $ZnO$:S, $ZnO$:Se, $ZnO$:Zn, $ZnS$:$Ag^+$,$Cl^-$, $ZnS$:Ag,Cu,Cl, $ZnS$:Ag,Ni, $ZnS$:Au,In, $ZnS$—$CdS$ (25-75), $ZnS$—$CdS$ (50-50), $ZnS$—$CdS$ (75-25), ZnS—CdS:Ag,Br,Ni, ZnS—CdS:Ag$^+$,Cl, ZnS—CdS:Cu, Br, ZnS—CdS:Cu,I, ZnS:Cl$^-$, ZnS:Eu$^{2+}$, ZnS:Cu, ZnS:Cu$^+$, Al$^{3+}$, ZnS:Cu$^+$,Cl$^-$, ZnS:Cu,Sn, ZnS:Eu$^{2+}$, ZnS:Mn$^{2+}$, ZnS: Mn,Cu, ZnS:Mn$^{2+}$,Te$^{2+}$, ZnS:P, ZnS:P$^{3-}$,Cl$^-$, ZnS:Pb$^{2+}$, ZnS:Pb$^{2+}$,Cl$^-$, ZnS:Pb,Cu, Zn$_3$(PO$_4$)$_2$:Mn$^{2+}$, Zn$_2$SiO$_4$: Mn$^{2+}$, Zn$_2$SiO$_4$:Mn$^{2+}$,As$^5$+, Zn$_2$SiO$_4$:Mn,Sb$_2$O$_2$, Zn$_2$SiO$_4$: Mn$^{2+}$,P, Zn$_2$Sia$_4$:Ti$^4$+, ZnS:Sn$^{2+}$, ZnS:Sn,Ag, ZnS:Sn$^{2+}$,Li+, ZnS:Te,Mn, ZnS—ZnTe:Mn$^{2+}$, ZnSe:Cu$^+$,Cl oder ZnWO$_4$.

The solvent comprised in said composition comprising the silazane-siloxane random copolymer is not particularly limited provided that the components of said composition have a certain solubility therein. Preferably, said solvent may be a non-polar or polar non-protic, preferably organic, solvent.

Preferred examples of suitable solvents may be selected from the group consisting of ethers, cyclic ethers, esters, hydrocarbons, aromatic solvents and any mixture of any of these.

Preferred examples of ethers are 1-methoxy-2-propylacetate and di-n-butylether.

A preferred example of a cyclic ether is tetrahydrofuran (THF). Preferred examples of ester are ethyl-acetate and n-butyl-acetate. Preferred examples of hydrocarbons are n-heptane and cyclohexane.

A preferred example of an aromatic solvent may be selected from the group consisting of toluene, ortho-xylene, meta-xylene, para-xylene and any mixture of any of these.

Said substrate may be any layer or material on which the composition of the present application as defined above may be deposited. Suitable substrates are not particularly limited in terms of material or shape. An exemplary substrate is an LED chip, i.e. the composition of the present application is directly applied onto an LED chip.

The composition comprising said silazane-siloxane random copolymer may be deposited on the substrate by any suitable method, for example with an industrial dispensing system.

In case the substrate is an LED chip, the composition preferably comprises at least 90 wt % or 95 wt % or 99 wt % or consists, with wt % relative to the total weight of said composition, of the silazane-siloxane random copolymer and the light emitting material and is applied directly to the LED chip. Suitable compositions preferably have a viscosity of at least 100 mPa s and of at most 100,000 mPa s, determined as described in the test methods. During the deposition of the composition on the substrate the viscosity of the composition may optionally be modified by changing the temperature at which the composition is deposited, for example, between 10° C. and 60° C.

Another possibility of applying the silazane-siloxane random copolymer and the light emitting material directly to the LED chip is by spray coating. A typical spray coating formulation consists of 2-10 wt % silazane-siloxane random copolymer, 10-25 wt % light emitting material, 63-88 wt % solvent and 0-2 wt % other additives, with the respective weight percentages of the components of the spray coating formulation adding up to 100 wt %. The solvent is either a pure solvent or a mixture of several solvents, usually a mixture of at least one high boiling and one low boiling solvent.

Alternatively, the silazane-siloxane random copolymer and the light emitting material may be applied by any other suitable method, such as screen printing or ink-jet printing.

After having been applied to the LED the silazane-siloxane random copolymer is preferably subjected to a heating step, wherein the material is heated to a temperature of from 100° C. to 250° C., preferably from 150° C. to 220° C., for a period of from 2 to 48 h, preferably of from 4 to 48 h.

Alternatively after having been applied to the LED the silazane-siloxane random copolymer may be subjected to a hydrolyzing step in a climate chamber. Preferred hydrolyzing conditions in a climate chamber are 4-24 h at 70-90° C. and a relative humidity of 70-90%.

The present process may be applied to a wide range of electronic devices. Preferably, said electronic device may be selected from the group consisting of field-effect transistors (FETs), thin-film transistors (TFTs), integrated circuits (ICs), logic circuits, capacitors, RFID tags (radio frequency identification tags), light emitting diodes (OLEDs), photovoltaic cells (PVs), photodetectors, laser diodes, photoconductors, electrophotographic devices, organic memory devices, sensor devices, charge injection layers, Schottky diodes, planarising layers, antistatic films, conducting substrates and conducting patterns. Most preferably, said electronic device is a light emitting diode.

Such light emitting diode may, for example, be used for backlights for liquid crystal displays, traffic light, outdoor displays, billboards, to name only a few non-limiting examples.

A typical LED package according to the invention comprises an LED chip, and/or a lead frame and/or gold wire and/or solder (flip chip) and/or the filling material, converter, an encapsulation material comprising the present silazane-siloxane random copolymer and a primary and secondary optic. The encapsulation material has the function of a surface protection material against external environmental influences and guarantees long term reliability in particular aging stability. For example, in accordance with the present invention a light emitting diode is constructed similarly to the ones described in U.S. Pat. Nos. 6,274,924 and 6,204,523.

Test Methods

Molecular weights of the polymers were determined by GPC against a polystyrene standard. As eluent a mixture of tetrahydrofuran and 1.45 wt % (relative to the total weight of the eluent) hexamethyldisilazane was used. Columns were Shodex KS-804 and 2× KS-802 and KS-801. The detector was an Agilent 1260 refractive index detector.

Viscosity was determined using a Brookfield Rheometer R/S plus with a Brookfield cone-type spindle RC3-50-1 at a rotation speed of 3 rpm and a temperature of 25° C.

EXAMPLES

The following examples are intended to illustrate the advantages of the present invention in an exemplary and non-limiting way.

Starting materials were obtained from commercial sources, for example dichlorosilane from Gelest Inc. USA, dichloromethylsilane and dichloro-dimethylsilane from Sigma-Aldrich, and the a,w-dichloro-dimethylsilicones from ABCR.

Alternatively, α,ω-dichloro-dimethylsilicones may be prepared by reacting water with an excess of dichlorodimethylsilane in an inert solvent, such as for example tetrahydrofuran or 1,4-dioxane. Using the dichlorodimethylsilane in an excess will lead to incomplete hydrolysis and therefore to Si—Cl groups remaining. Solvent and unreacted dichlorodimethylsilane may be removed by distillation under reduced pressure to yield a colorless oil, which may be used without further purification or may further be purified by column chromatography or other methods.

Example 1

A 4 l pressure vessel was charged with 1500 g of liquid ammonia at 0° C. and a pressure of between 3 bar and 5 bar. A mixture of 359 g dichlorosilane and 442 g 1,3-dichlorotetramethyldisiloxane was slowly added over a period of 3 h. After stirring the resulting reaction mixture for an additional 3 h the stirrer was stopped and the lower phase isolated and evaporated to remove dissolved ammonia. After filtration 409 g of a colorless viscous oil remained.

Example 2

A 4 l pressure vessel was charged with 1500 g of liquid ammonia at 0° C. and a pressure of between 3 bar and 5 bar. A mixture of 168 g dichlorosilane, 231 g dichloro-methylsilane and 419 g 1,3-dichloro-tetramethyldisiloxane were slowly added over a period of 3 h. After stirring the resulting reaction mixture for an additional 3 h the stirrer was stopped and the lower phase was isolated and evaporated to remove dissolved ammonia. After filtration 422 g of a colorless viscous oil remained.

Example 3

A 4 l pressure vessel was charged with 1500 g of liquid ammonia at 0° C. and a pressure of between 3 bar and 5 bar. A mixture of 168 g dichlorosilane, 237 g dichloromethylsilane and 556 g 1,5-dichloro-hexamethyltrisiloxane were slowly added over a period of 3 h. After stirring the resulting reaction mixture for an additional 3 h the stirrer was stopped and the lower phase was isolated and evaporated to remove dissolved ammonia. After filtration 545 g of a colorless viscous oil remained.

Example 4

A 4 l pressure vessel was charged with 1500 g of liquid ammonia at 0° C. and a pressure of between 3 bar and 5 bar. A mixture of 442 g dichloromethylsilane and 384 g 1,3-dichlorotetramethyldisiloxane were slowly added over a period of 3 h. After stirring the resulting reaction mixture for an additional 3 h the stirrer was stopped and the lower phase was isolated and evaporated to remove dissolved ammonia. After filtration 429 g of a colorless viscous oil remained.

Example 5

A 4 l pressure vessel was charged with 1500 g of liquid ammonia at 0° C. and a pressure of between 3 bar and 5 bar. A mixture of 244 g dichloromethylsilane, 266 g dichlorodimethylsilane and 429 g 1,5-dichlorohexamethyltrisiloxane were slowly added over a period of 3 h. After stirring the resulting reaction mixture for an additional 3 h the stirrer was stopped and the lower phase was isolated and evaporated to remove dissolved ammonia. After filtration 526 g of a colorless viscous oil remained.

Example 6

A 4 l pressure vessel was charged with 1500 g of liquid ammonia at 0° C. and a pressure of between 3 bar and 5 bar. A mixture of 503 g dichloromethylsilane and 645 g 1,7-dichlorooctamethyltetrasiloxane were slowly added over a period of 3 h. After stirring the resulting reaction mixture for an additional 3 h the stirrer was stopped and the lower phase was isolated and evaporated to remove dissolved ammonia. After filtration 703 g of a colorless viscous oil remained.

Example 7

A 2 l flask was charged with a mixture of mixture of 44 g dichloromethylsilane, 56 g 1,3-dichlorotetramethyldisiloxane and 1500 ml n-heptane. The reaction solution was cooled to 0° C. and over a period of 2 h gaseous ammonia was bubbled below the surface of the solution, until no further salt formation was observed. After raising the temperature to room temperature, the precipitated ammonium chloride was removed by filtration, and the resulting colorless and transparent solution was reduced to dryness at a temperature of 50° C. under a vacuum of 40 mbar or less. 51 g of a colorless low viscous oil remained.

Example 8

A 2 l flask was charged with a mixture of mixture of 44 g dichloromethylsilane, 56 g 1,3-dichlorotetramethyldisiloxane and 1500 ml n-heptane. The reaction solution was cooled to 0° C. and over a period of 2 h gaseous methylamine was bubbled below the surface of the solution, until no further salt formation was observed. After raising the temperature to room temperature, the precipitated methylammonium chloride was removed by filtration, and the resulting colorless and transparent solution was reduced to dryness at a temperature of 50° C. under a vacuum of 40 mbar or less. 56 g of a colorless low viscous oil remained.

Example 9

A 2 l flask was charged with a mixture of mixture of 41 g dichloromethylsilane, 59 g 1,7-dichlorooctamethyltetrasiloxane and 1500 ml n-heptane. The reaction solution was cooled to 0° C. and over a period of 2 h gaseous ammonia was bubbled below the surface of the solution, until no further salt formation was observed. After raising the temperature to room temperature, the precipitated ammonium chloride was removed by filtration, and the resulting colorless and transparent solution was reduced to dryness at a temperature of 50° C. under a vacuum of 40 mbar or less. 39 g of a colorless low viscous oil remained.

Example 10 Fluoride-Catalyzed Crosslinking 100 g of the polymer of Example 4 were dissolved in 100 g 1,4-dioxane and cooled to 0° C. 100 mg tetramethylammonium fluoride were added, and the resulting reaction mixture was stirred for 4h, until gas formation stopped. 250 g xylene were added and the temperature was raised to room temperature. The turbid solution was filtrated, and the resulting clear solution was reduced to dryness at a temperature of 50° C. under a vacuum of 20 mbar or less. 95 g of a colorless highly viscous oil remained. The respective molecular weights of the polymer of Example 4 and the crosslinked polymer are indicated in Table 1.

Example 11 Base-Catalyzed Crosslinking 100 g of the polymer of Example 4 were dissolved in 100 g 1,4-dioxane and cooled to 0° C. 100 mg KH were added and the reaction solution was stirred for 4h, until gas formation stopped. 300 mg chlorotrimethylsilane and 250 g xylene were added and the temperature was raised to room temperature. The turbid solution was filtrated and the resulting clear solution was reduced to dryness at a temperature of 50° C. under a vacuum of 20 mbar or less. 95 g of a colorless highly viscous oil remained. The respective molecular weights of the polymer of Example 4 and the crosslinked polymer are indicated in Table 1.

TABLE 1

| Polymer | $M_n$ [g mol$^{-1}$] |
| --- | --- |
| Example 4 | 3,100 |
| Example 10 | 5,200 |
| Example 11 | 4,750 |

Example 12

To show its usefulness for LED devices, the polymer obtained in the examples were blended with phosphor light converter particles (available from Merck KGaA) in weight ratios ranging from 1:1 to 1:3, and the blend then coated as a 40 μm to 80 μm thick layer onto an LED chip mounted onto an LED package (available from Excelitas). For curing the polymer the LED was then placed on a hotplate at 150° C. for 8 hours.

The finished LED was first operated for 24 hours at a starting current of 0.5 A. If no crack formation in the coating of the LED could be detected by microscope the current was raised in steps of 0.1 A, the LED operated for another 24 hours and inspected by microscope until the current for which crack formation could be observed. Because the LED current relates to the temperature of the chip this method gives an indication to the temperature resistance and the longevity of the so-produced LEDs. Table 2 shows the highest LED currents at which no crack formation had occurred for the LEDs produced with the polymers of the examples as well as for LEDs produced with phenylsilicone, Durazane 1033 and Durazane 1066 as reference materials. An example of a phenylsilicone is OE-6550, commercially available from Dow Corning, USA. Durazane 1033 and Durazane 1066 are organopolysilazanes, commercially available from Merck, Darmstadt, Germany.

TABLE 2

| Polymer | Highest current without crack formation [A] |
| --- | --- |
| Ex. 1 | 1.6 |
| Ex. 2 | 1.7 |
| Ex. 3 | 1.6 |
| Ex. 4 | 1.6 |
| Ex. 5 | 1.7 |
| Ex. 6 | 1.6 |
| Ex. 7 | 1.6 |
| Ex. 8 | 1.7 |
| Ex. 9 | 1.9 |
| Ex. 10 | 1.9 |
| Ex. 11 | 1.8 |
| Phenylsilicone | 1.5 |
| Durazane 1033 | 1.0 |
| Durazane 1066 | 1.1 |

The present results clearly show that the present silazane-siloxane random copolymers are characterized by excellent temperature resistance and/or longevity when compared to conventional materials, such as for example to phenylsilicone or organopolysilazanes.

The invention claimed is:

1. A method for producing an electronic device, comprising:
   obtaining a silazane-siloxane random copolymer by reacting an organosilane, an amine and an organosiloxane, wherein the organosilane comprises two halogen end groups and the organosiloxane is of formula (II-a)

$$X^3-[SiR^3R^4-O-]_a SiR^3R^4-X^4 \quad \text{(II-a)}$$

and the amine is of formula (III)

$$NH_2R^5 \quad \text{(III)}$$

wherein
   $X^3$ and $X^4$ are at each occurrence independently selected from the group consisting of OH, Cl, Br, I;
   $R^3$, $R^4$ and $R^5$ are at each occurrence independently H or a carbyl group; and
   a is an integer of at least 1 and at most 10; and
   providing a composition comprising the so-obtained silazane-siloxane random copolymer and applying the composition to a substrate of an electronic device.

2. Method according to claim 1, wherein the organosilane is of formula (I-a)

$$X^1-SiR^1R^2-X^2 \quad \text{(I-a)}$$

wherein
   $R^1$ and $R^2$ are at each occurrence independently H or carbyl; and
   $X_1$ and $X^2$ are at each occurrence independently selected from the group consisting of Cl, Br, I.

3. Method according to claim 1, wherein the electronic device is an LED chip and the silazane-siloxane random copolymer is deposited directly onto the LED chip.

4. Method according to claim 1, wherein said composition further comprises a light emitting material.

5. Method according to claim 4, wherein the light emitting material is a phosphor.

6. A method for producing an electronic device, comprising:
   (a) obtaining a silazane-siloxane random copolymer by reacting an organosilane, ammonia or an amine and an organosiloxane,
   (b) providing a composition comprising the so-obtained silazane-siloxane random copolymer, and
   (c) subsequently depositing said composition on a substrate of an electronic device.

7. Method according to claim 6, wherein the silazane-siloxane random copolymer comprises a first monomer unit $M^1$ and a second monomer unit $M^2$ in random sequence, wherein the first monomer unit $M^1$ is of formula (I) and the second monomer unit $M^2$ is of formula (II)

$$-[-SiR^1R^2-NR^5-]- \quad \text{(I)}$$

$$-[-SiR^3R^4-[-O-SiR^3R^4-]_a-NR^5-]- \quad \text{(II)}$$

wherein
   $R^1$, $R^2$, $R^3$, $R^4$ and $R^5$ are at each occurrence independently of each other selected from the group consisting of H and carbyl; and
   a is an integer of at least 1 and at most 10.

8. Method according to claim 7, wherein $R^1$ and $R^2$ are at each occurrence independently H or alkyl having at least 1 and at most 20 carbon atoms or phenyl.

9. Method according to claim 7, wherein $R^1$ and $R^2$ are independently H or methyl.

10. Method according to claim 7, wherein $R^3$ and $R^4$ are at each occurrence independently H or alkyl having at least 1 and at most 40 carbon atoms or phenyl.

11. Method according to claim 7, wherein $R^3$ and $R^4$ are independently methyl or phenyl.

12. Method according to claim 7, wherein $R^5$ is at each occurrence independently H or alkyl having at least 1 and at most 20 carbon atoms or phenyl.

13. Method according to claim 7, wherein $R^5$ is at each occurrence independently H or methyl.

14. Method according to claim 6, wherein the electronic device is an LED chip and the silazane-siloxane random copolymer is deposited directly onto the LED chip.

15. Method according to claim 6, wherein said composition further comprises a light emitting material.

16. Method according to claim 15, wherein the light emitting material is a phosphor.

17. Method according to claim 7, wherein: $R^1$ and $R^2$ are at each occurrence independently H or alkyl having at least 1 and at most 20 carbon atoms or phenyl; $R^3$ and $R^4$ are at each occurrence independently H or alkyl having at least 1 and at most 40 carbon atoms or phenyl; and $R^5$ is at each occurrence independently H or alkyl having at least 1 and at most 20 carbon atoms or phenyl.

\* \* \* \* \*